United States Patent
Nakagawasai (12) United States Patent (10) Patent No.: US 11,608,555 B2
(45) Date of Patent: Mar. 21, 2023

(54) SPUTTERING APPARATUS

(71) Applicant: TOKYO ELECTRON LIMITED, Tokyo (JP)

(72) Inventor: Manabu Nakagawasai, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 98 days.

(21) Appl. No.: 17/198,756

(22) Filed: Mar. 11, 2021

(65) Prior Publication Data

US 2021/0285092 A1  Sep. 16, 2021

(30) Foreign Application Priority Data

Mar. 13, 2020  (JP) .............................. JP2020-044361

(51) Int. Cl.
| | | |
|---|---|---|
| *C23C 14/35* | (2006.01) | |
| *C23C 14/50* | (2006.01) | |
| *H01J 37/34* | (2006.01) | |
| *H01J 37/32* | (2006.01) | |
| *C23C 14/56* | (2006.01) | |
| *C23C 14/22* | (2006.01) | |

(52) U.S. Cl.
CPC .......... *C23C 14/352* (2013.01); *C23C 14/225* (2013.01); *C23C 14/351* (2013.01); *C23C 14/505* (2013.01); *C23C 14/564* (2013.01); *C23C 14/568* (2013.01); *H01J 37/32642* (2013.01); *H01J 37/34* (2013.01); *H01J 37/3405* (2013.01); *H01J 37/3411* (2013.01); *H01J 2229/0705* (2013.01)

(58) Field of Classification Search
CPC ... C23C 14/352; C23C 14/505; C23C 14/568; C23C 14/225; C23C 14/351; C23C 14/564; C23C 14/50; C23C 14/34; H01J 37/34; H01J 37/3405; H01J 2229/0705; H01J 37/3426; H01J 37/3461; H01J 37/3411; H01J 37/3441; H01J 37/3447; H01J 37/32642
USPC ..................................................... 204/298.11
See application file for complete search history.

(56) References Cited

U.S. PATENT DOCUMENTS

| | | | |
|---|---|---|---|
| 6,344,105 B1 * | 2/2002 | Daugherty | ........ H01L 21/68735 156/915 |
| 8,986,522 B2 * | 3/2015 | Wickramanayaka | ........................ C23C 14/505 204/298.11 |
| 2004/0112294 A1 * | 6/2004 | Allen | ................ H01J 37/32623 118/728 |

(Continued)

FOREIGN PATENT DOCUMENTS

JP  4336320 B2  9/2009

*Primary Examiner* — Jennifer Wecker
*Assistant Examiner* — Patrick S Ott
(74) *Attorney, Agent, or Firm* — Fenwick & West LLP (57) ABSTRACT

A sputtering apparatus includes a base on which a substrate is mounted, an annular member disposed at an outer periphery of the base to surround a side surface and a backside of the substrate without in contact with the substrate, and an edge cover that covers an outer edge of an upper surface of the substrate mounted on the base. The annular member has a first surface facing the backside of the substrate mounted on the base with a gap, a second surface facing the side surface of the substrate mounted on the base with a gap, and a tapered surface formed at a corner portion between the first surface and the second surface.

13 Claims, 7 Drawing Sheets

(56) References Cited

U.S. PATENT DOCUMENTS

| | | | |
|---|---|---|---|
| 2011/0159200 A1* | 6/2011 | Kogure | H01L 21/68721 118/500 |
| 2011/0223346 A1* | 9/2011 | Kitada | H01J 37/3405 427/523 |
| 2016/0104603 A1* | 4/2016 | Wei | H01J 37/32477 204/298.11 |

* cited by examiner

SPUTTERING APPARATUS

CROSS-REFERENCE TO RELATED APPLICATION

This application claims priority to Japanese Patent Application No. 2020-044361, filed on Mar. 13, 2020, the entire contents of which are incorporated herein by reference.

TECHNICAL FIELD

The present disclosure relates to a sputtering apparatus.

BACKGROUND

There is known a sputtering apparatus for forming a film by causing particles (film-forming atoms) emitted from a target material to be incident on a substrate such as a wafer or the like.

Japanese Patent No. 4336320 discloses a sputtering apparatus including a rotatable wafer holder on which a wafer is placed. In this sputtering apparatus, sputtered atoms from a target are obliquely incident on a wafer surface at a predetermined angle. The wafer holder has a rotatable wafer stage on which a wafer is placed and a wafer stage outer ring that surrounds the wafer stage and is configured to rotate together with the wafer stage.

In the sputtering apparatus for forming a film on a surface of a substrate, it is required to suppress adhesion of particles to a backside of the substrate or to a substrate support on which the substrate is placed.

SUMMARY

The present disclosure provides a sputtering apparatus that suppresses adhesion of particles to a backside of a substrate or to a substrate support on which the substrate is placed.

In accordance with an aspect of the present disclosure, there is provided a sputtering apparatus including: a base on which a substrate is placed; an annular member disposed at an outer periphery of the base to surround a side surface and a backside of the substrate without in contact with the substrate; and an edge cover that covers an outer edge of an upper surface of the substrate placed on the base. Further, the annular member has a first surface facing the backside of the substrate placed on the base with a gap, a second surface facing the side surface of the substrate placed on the base with a gap, and a tapered surface formed at a corner portion between the first surface and the second surface.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of the present disclosure will be described in detail with reference to the accompanying drawings. Like reference numerals will be given to like parts throughout the drawings, and redundant description thereof may be omitted.

<Sputtering Apparatus 1>

Figure 1:
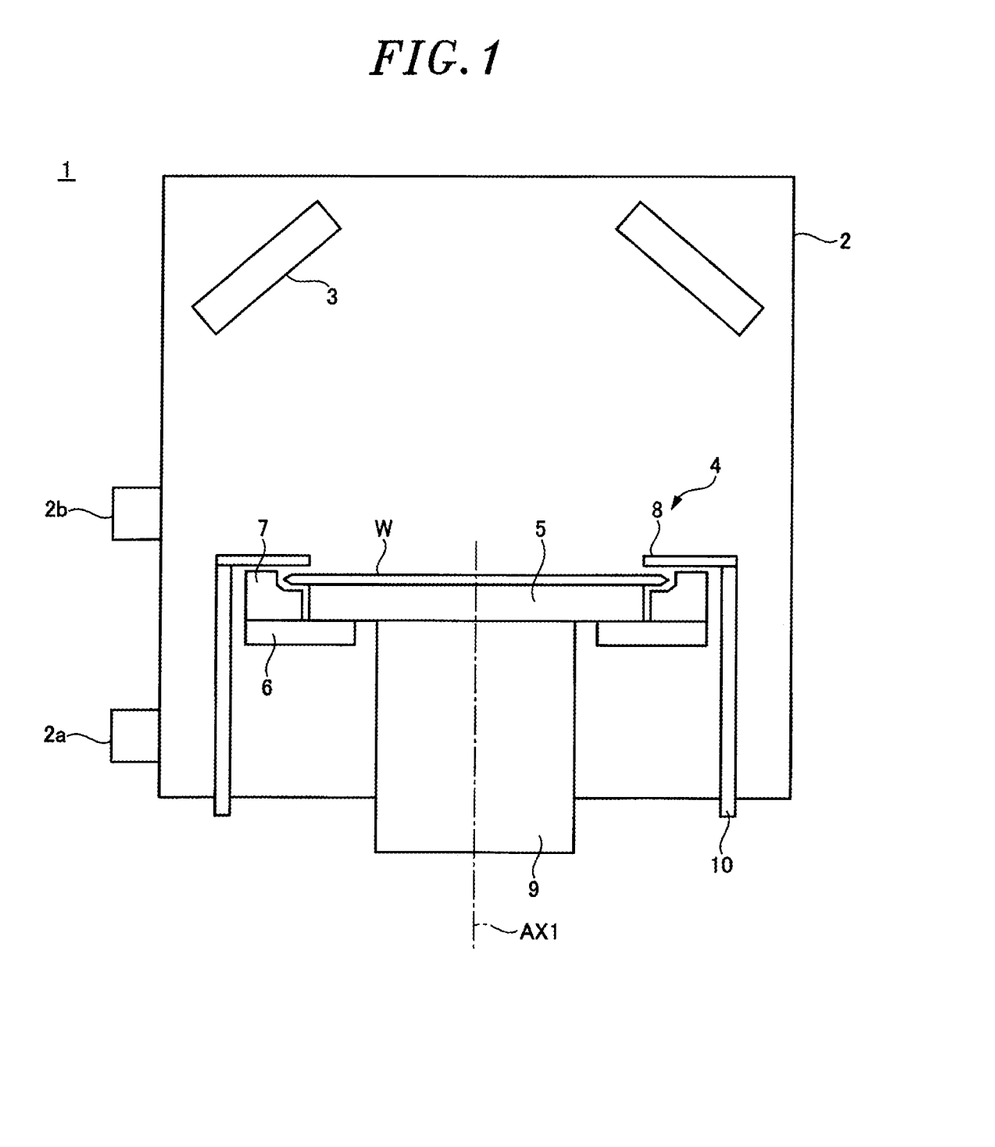
FIG. 1 is an example of a cross-sectional view schematically showing a sputtering apparatus according to an embodiment.

The sputtering apparatus 1 according to an embodiment will be described with reference to FIG. 1. FIG. 1 is an example of a cross-sectional view schematically showing the sputtering apparatus 1 according to the embodiment.

The sputtering apparatus 1 includes a vacuum chamber 2, a target 3, and a substrate supporting unit 4. The sputtering apparatus 1 is, e.g., a physical vapor deposition (PVD) apparatus for forming a film by adhering sputtered particles (film-forming atoms) emitted from the target 3 onto a surface of a substrate W placed on the substrate supporting unit 4 in the vacuum chamber 2.

The vacuum chamber 2 has a vacuum port 2a and a loading/unloading port 2b. The vacuum port 2a is connected to a gas exhaust unit (not shown), and reduces a pressure in the vacuum chamber 2 to a vacuum atmosphere. The loading/unloading port 2b is openable and closable, and is configured such that the substrate W can be loaded into the vacuum chamber 2 and unloaded from the vacuum chamber 2 through the loading/unloading port 2b.

The target 3 is disposed in the vacuum chamber 2 and emits sputtered particles. Further, the target 3 is disposed at a predetermined angle with respect to the surface of the substrate W placed on the substrate supporting unit 4. In other words, the surface of the target 3 (the surface that emits the sputtered particles) is disposed to be inclined with respect to an axis AX1 passing through a center of a base 5 in a vertical direction.

The substrate supporting unit 4 includes the base 5, a wafer holder base 6, a wafer holder 7, and an edge cover 8.

The base 5 has an electrostatic chuck (not shown) and is configured to attract the substrate W. Further, the base 5 is provided with elevating pins (not shown) such that the substrate W can be lifted upward from the base 5. The axis AX1 passes through the center of the base 5 in the vertical direction.

The wafer holder base 6 fixes the wafer holder 7 to the base 5. The wafer holder 7 is disposed at an outer peripheral side of the base 5 and is fixed to the wafer holder base 6.

The edge cover 8 is disposed to cover an outer edge of the substrate W placed on the base 5 when viewed from the target 3.

The substrate supporting unit 4 has a rotating elevating mechanism 9 and an edge cover driving unit 10. The rotating elevating mechanism 9 is configured to raise and lower the base 5 in an axial direction of the axis AX1 and to rotate the base 5 about the axis AX1. Accordingly, the rotating elevating mechanism 9 is configured to raise and lower and rotate the base 5, the wafer holder base 6, the wafer holder 7, and the substrate W attracted on the base 5. The edge cover driving unit 10 is configured to raise and lower the edge cover 8 in the axial direction of the axis AX1.

An example of an operation of the sputtering apparatus 1 will be described.

In the case of loading the substrate W, the loading/unloading port 2b is opened. The base 5 is disposed at a predetermined height by the rotating elevating mechanism 9. The edge cover 8 is lifted by the edge cover driving unit 10 and has a space for loading the substrate W into a space between the base 5 and the edge cover 8. Further, the elevating pins (not shown) of the base 5 protrude from a substrate supporting surface of the base 5.

A transfer mechanism (not shown) loads the substrate W into the vacuum chamber 2 through the loading/unloading port 2b and the space between the base 5 and the edge cover 8, and transfers the substrate W to and from the lifting pins (not shown) of the base 5. When the transfer mechanism retreats from the vacuum chamber 2, the loading/unloading port 2b is closed. The substrate W is placed on the base 5 by lowering the elevating pins. Further, the substrate W is attracted to the base 5 by the electrostatic chuck (not shown). The outer edge of the substrate W is covered with the edge cover 8 by the edge cover driving unit 10.

An inner atmosphere of the vacuum chamber 2 becomes a vacuum atmosphere by the gas exhaust unit (not shown) connected to the vacuum port 2a. The base 5 is disposed at a predetermined height by the rotating elevating mechanism 9, and rotates about the axis AX1. The target 3 emits sputtered particles. Accordingly, the sputtered particles are deposited on the surface of the substrate W attracted on the base 5 to form a film of sputtered particles on the substrate W.

When a desired film is formed on the surface of the substrate W, the substrate W is unloaded from the vacuum chamber 2 in the reverse order of loading the substrate W.

Figure 2:
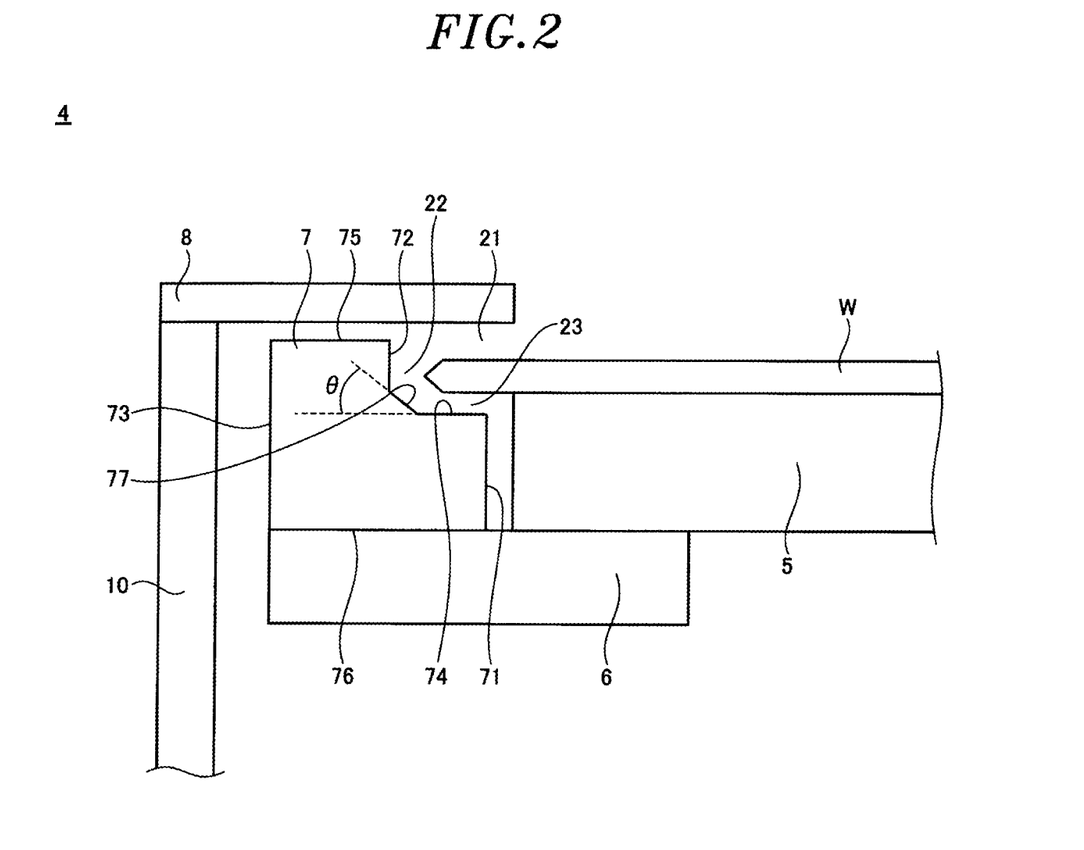
FIG. 2 is an example of a partially enlarged cross-sectional view schematically showing a substrate supporting unit of the sputtering apparatus according to the embodiment.

Next, the substrate supporting unit 4 of the sputtering apparatus 1 will be further described with reference to FIG. 2. FIG. 2 is an example of a partially enlarged cross-sectional view schematically showing the substrate supporting unit 4 of the sputtering apparatus 1 according to the embodiment.

The base 5 is a disc-shaped member. The upper surface of the base 5 serves as a substrate supporting surface on which the substrate W is placed. An outer diameter of the base 5 is smaller than an outer diameter of the substrate W.

The wafer holder base 6 is an annular member, and extends outward in a radial direction from the outer edge on the bottom surface of the base 5, for example.

The wafer holder 7 is a stepped annular member and is made of, e.g., a non-magnetic metal such as aluminum or the like. The wafer holder 7 has a lower inner peripheral surface 71, an upper inner peripheral surface 72, an outer peripheral surface 73, an inner upper surface 74, an outer upper surface 75, a bottom surface 76, and a corner portion 77.

The lower inner peripheral surface 71 is a cylindrical surface extending from the bottom surface 76 to the inner upper surface 74. An inner diameter of the lower inner peripheral surface 71 is greater than an outer diameter of the base 5 and smaller than an outer diameter of the substrate W. The upper inner peripheral surface 72 is a cylindrical surface extending from the upper end of the corner portion 77 to the inner upper surface 74. An inner diameter of the upper inner peripheral surface 72 is greater than the inner diameter of the lower inner peripheral surface 71 and greater than the outer diameter of the substrate W. Therefore, a radial gap 22 is formed between the inner upper surface 74 and the side surface of the substrate W. The outer peripheral surface 73 is a cylindrical surface extending from the bottom surface 76 to the outer upper surface 75. An outer diameter of the outer peripheral surface 73 is greater than the inner diameter of the upper inner peripheral surface 72. The wafer holder 7 is disposed such that the central axes of the lower inner peripheral surface 71, the upper inner peripheral surface 72, and the outer peripheral surface 73 coincide with the axis AX1 of the base 5.

The inner upper surface 74 is formed at a position lower than the upper surface of the base 5 (the substrate supporting surface on which the substrate W is placed). Since the inner upper surface 74 is lower than the upper surface of the base 5, the substrate W can be reliably placed on the upper surface of the base 5 and fixed to the base 5 by the electrostatic chuck. The inner upper surface 74 is formed at a position lower than the backside of the substrate W placed on the base 5. Therefore, a bottom surface gap 23 is formed between the inner upper surface 74 and the backside of the substrate W. The outer upper surface 75 is formed at a position higher than the inner upper surface 74. Further, the outer upper surface 75 is formed at a position higher than the upper surface of the substrate W placed on the base 5, for example. The outer upper surface 75 may be formed at a height substantially equal to the upper surface of the substrate W placed on the base 5, or may be formed at a position lower than the upper surface of the substrate W placed on the base 5.

The corner portion 77 is formed between the upper inner peripheral surface 72 and the inner upper surface 74. The corner portion 77 has a tapered surface having an angle θ.

The edge cover 8 is an annular member, and is made of, e.g., aluminum or the like. An inner diameter of the inner peripheral surface of the edge cover 8 is smaller than the outer diameter of the substrate W. Further, the edge cover 8 is disposed such that the central axis of the inner peripheral surface coincides with the axis AX1 of the base 5. Further, the edge cover 8 is separated from the substrate W in the height direction. Therefore, an upper surface gap 21 is formed between the bottom surface of the edge cover 8 and the upper surface of the substrate W.

In the sputtering apparatus 1, it is preferable that sputtered particles are not adhered to the backside of the substrate W or the upper surface (substrate supporting surface) of the base 5. If conductive sputtered particles (e.g., metal atoms) are adhered to the upper surface (substrate supporting surface) of the base 5, the attracting property of the electrostatic chuck may be affected.

Figure 3:
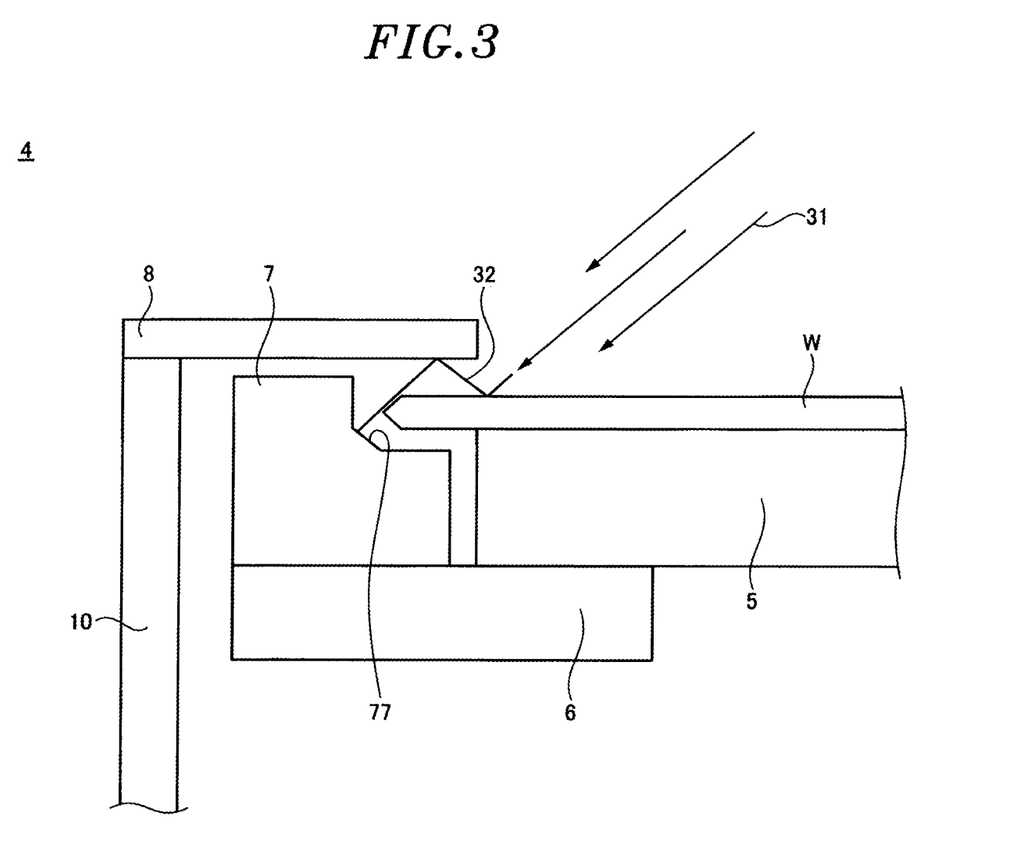
FIG. 3 is an example of a partially enlarged cross-sectional view schematically showing a path of sputtered particles at the substrate supporting unit of the sputtering apparatus according to the embodiment.
Figure 4:
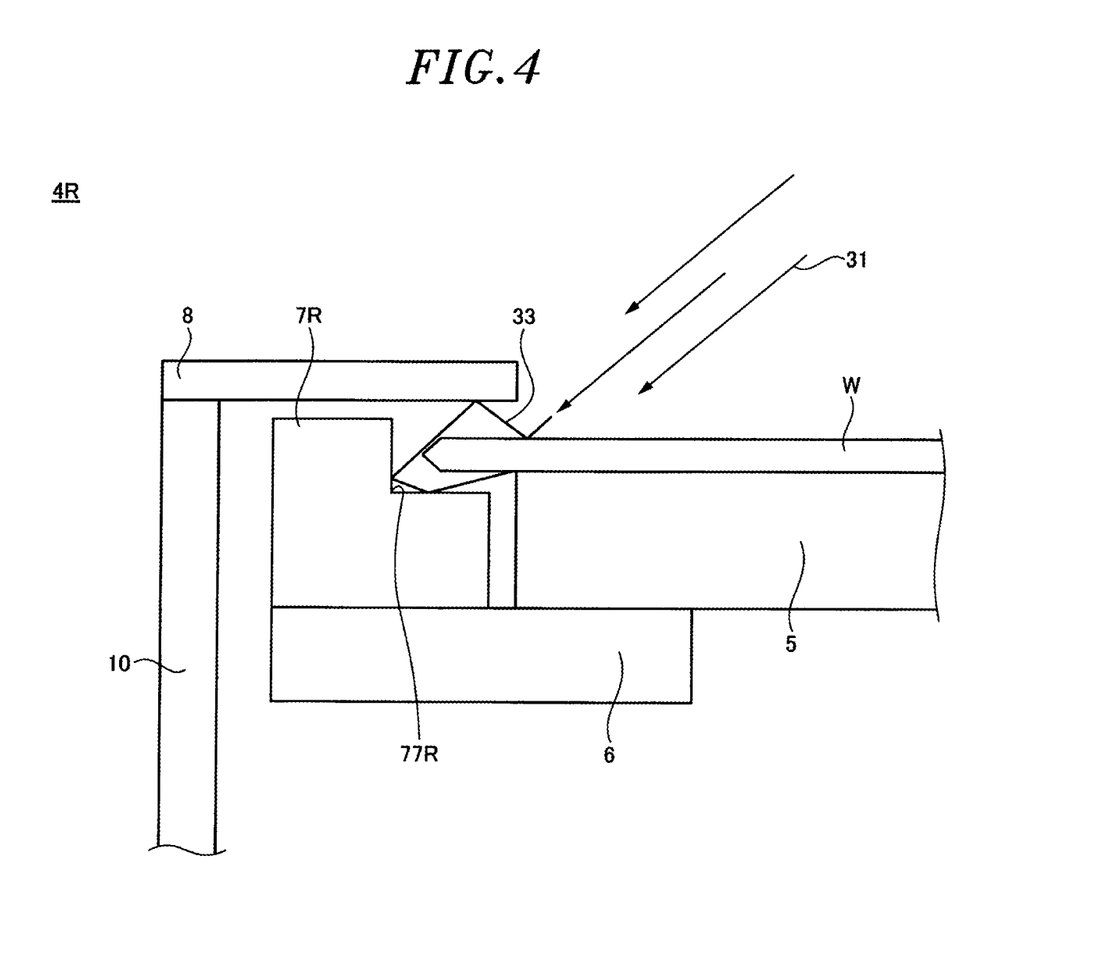
FIG. 4 is an example of a partially enlarged cross-sectional view schematically showing a path of sputtered particles at a substrate supporting unit of a sputtering apparatus according to a reference example.

Next, the sputtering apparatus 1 according to the embodiment will be compared with the sputtering apparatus according to a reference example. FIG. 3 is an example of partially enlarged cross-sectional view schematically showing the path of sputtered particles at the substrate supporting unit 4 of the sputtering apparatus 1 according to the embodiment. FIG. 4 is an example of a partially enlarged cross-sectional view schematically showing the path of sputtered particles at a substrate supporting unit 4R of the sputtering apparatus according to the reference example.

In this specification, the sputtering apparatus according to the reference example is different from the sputtering apparatus according to the embodiment in the shape of the wafer holder 7R of the substrate supporting unit 4R shown in FIG.

4. Specifically, the wafer holder 7R has a rectangular corner portion 77R. Other configurations of the sputtering apparatus according to the reference example are the same as those of the sputtering apparatus 1 according to the embodiment shown in FIGS. 2 and 3, and redundant description thereof will be omitted.

As shown in FIG. 1, the target 3 is inclined with respect to the axis AX1. Therefore, the sputtered particles are obliquely incident on the surface of the substrate W in an incident direction 31 indicated by arrows. Parts of the incident sputtered particles are attracted (deposited) on the incident surface, and the other parts of the incident sputtered particles rebound.

In the substrate supporting unit 4R of the sputtering apparatus according to the reference example, as shown in FIG. 4, a path 33 of the rebounded sputtered particles reaches the backside of the substrate W. Therefore, the sputtered particles may be adhered to the backside of the substrate W or to the upper surface of the base 5.

On the other hand, in the substrate supporting unit 4 of the sputtering apparatus 1 according to the embodiment, the corner portion 77 has a tapered surface as shown in FIGS. 2 and 3. Therefore, a path 32 of the sputtered particles is prevented from reaching the backside of the substrate W by changing the rebound direction of the sputtered particles. Accordingly, it is possible to prevent the rebounded sputtered particles from being adhered to the backside of the substrate W or to the upper surface of the base 5.

By setting the angle θ (see FIG. 2) between the tapered surface of the corner 77 and a planar surface including the inner upper surface 74 to be greater than or equal to 45° and smaller than or equal to 60°, it is possible to change the rebound direction of the sputtered particles and prevent the rebounded sputtered particles from being adhered to the backside of the substrate W or to the upper surface of the base 5.

It is preferable that the upper end of the tapered surface of the corner portion 77 is formed at a position lower than the backside of the substrate W. In other words, it is preferable that the upper end of the tapered surface of the corner portion 77 is formed at a portion lower than the upper surface (substrate supporting surface) of the base 5. Accordingly, even if the substrate W placed on the base 5 is displaced in the radial direction, the amount of displacement can be limited because the outer peripheral portion of the substrate W is locked by the upper inner peripheral surface 72. In addition, it is possible to prevent the edge on the bottom surface of the substrate W from being positioned on the tapered surface. Accordingly, the substrate W can be reliably placed on the substrate supporting surface of the base 5 and attracted by the electrostatic chuck.

The configuration of the sputtering apparatus 1 according to the embodiment is not limited thereto.

FIGS. 5A to 5D are examples of a cross-sectional view schematically showing wafer holders 7A to 7D according to modifications. As illustrated, the wafer holders 7A to 7D may have recesses 74a to 74d formed on the inner upper surface 74, respectively. The sputtered particles that entered the recesses 74a to 74d are rebounded in the recesses 74a to 74d, so that the frequency of rebound can be increased. In other words, by adhering the sputtered particles to the inner walls of the recesses 74a to 74d, it is possible to prevent the rebounded sputtered particles from being adhered to the backside of the substrate W or to the upper surface of the base 5.

Figure 5A:
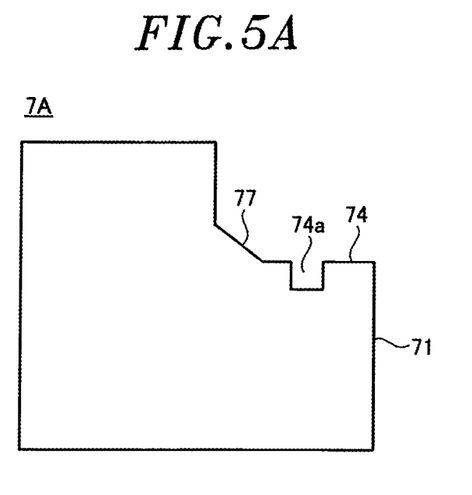
FIGS. 5A to 5D are examples of a cross-sectional view schematically showing a wafer holder according to modifications.
Figure 5B:
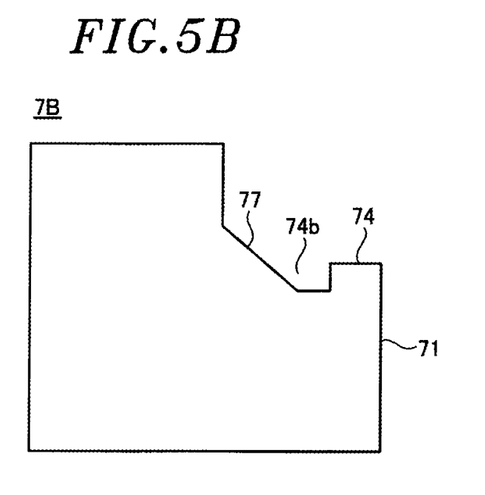
Figure 5C:
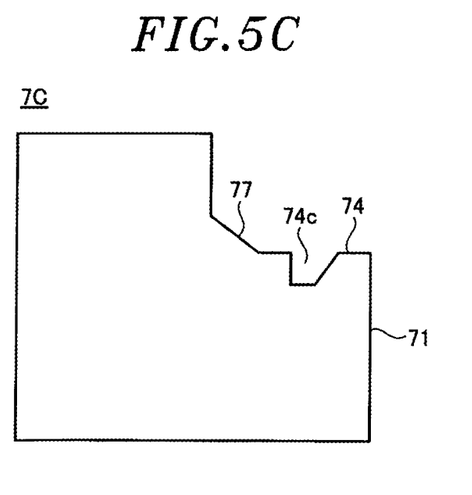
Figure 5D:
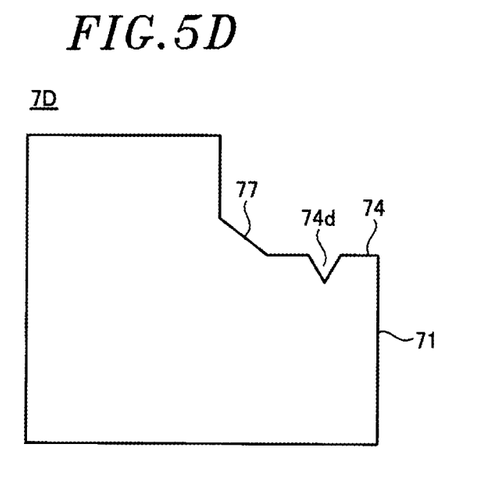

The rectangular recess 74a may be formed as in the wafer holder 7A shown in FIG. 5A. Further, an outer peripheral side surface of the recess 74b may be extended from the tapered surface of the corner 77 as in the wafer holder 7B shown in FIG. 5B. Further, the inner peripheral side surface of the recess 74c may be formed as a tapered surface as in the wafer holder 7C shown in FIG. 5C. Therefore, the sputtered particles rebounded on the tapered surface can be rebounded outward in the radial direction. Further, the recess 74d may have a wedge shape as in the wafer holder 7D shown in FIG. 5D. Accordingly, the processing of the recess 74d can be facilitated, and the sputtered particles can be rebounded outward in the radial direction on the tapered inner peripheral side surface of the recess 74d.

Further, a protrusion (not shown) may be formed on the inner upper surface 74 of the wafer holder 7. Accordingly, the frequency of rebound of the sputtered particles is increased. In other words, the sputtered particles are adhered to the protrusion, so that it is possible to prevent the rebounded sputtered particles from being adhered to the backside of the substrate W or to the upper surface of the base 5.

Further, the wafer holders 7 and 7A to 7D may have uneven surfaces by blasting or the like. Accordingly, the sputtered particles are adhered to the surfaces of the wafer holders 7 and 7A to 7D, which makes it possible to prevent the rebounded sputtered particles from being adhered to the backside of the substrate W or to the upper surface of the base 5. The blasting may be performed on the entire surface of the wafer holders 7 and 7A to 7D, or may be performed on a part of the surfaces of the wafer holders 7 and 7A to 7D.

Figure 6:
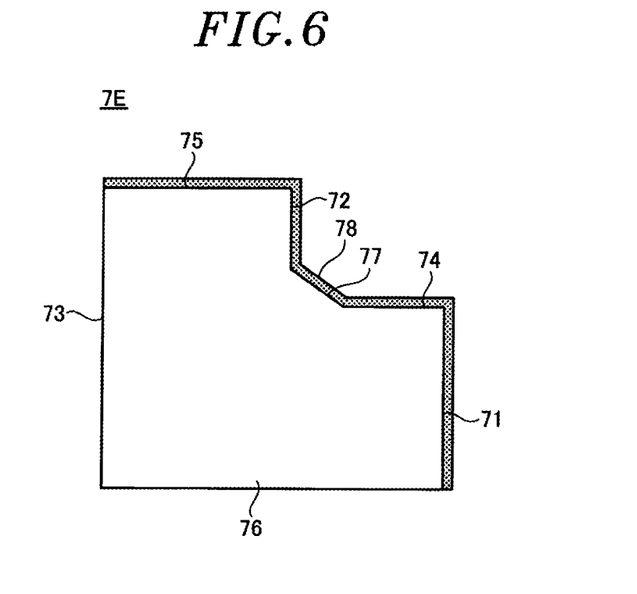
FIGS. 6 and 7 are examples of a cross-sectional view schematically showing the wafer holder according to modifications.

FIG. 6 is an example of a cross-sectional view schematically showing a wafer holder 7E according to a modification. When the sputtered particles emitted from the target 3 are magnetic particles, a magnetic functional surface 78 may be formed on the surface of the wafer holder 7E. The magnetic functional surface 78 has a magnetic field and actively collects magnetic particles. Accordingly, it is possible to prevent the rebounded sputtered particles from being adhered to the backside of the substrate W or to the upper surface of the base 5. The magnetic functional surface 78 may be formed across, e.g., the outer upper surface 75, the upper inner peripheral surface 72, the corner portion 77, the inner upper surface 74, and the lower inner peripheral surface 71.

By embedding a magnet (not shown) in the wafer holder 7E, for example, the wafer holder 7E may serve as the magnetic functional surface 78. Further, by forming a magnetic material film on the surface of the wafer holder 7E and magnetizing the magnetic material film, for example, the wafer holder 7E may serve as the magnetic functional surface 78.

Figure 7:
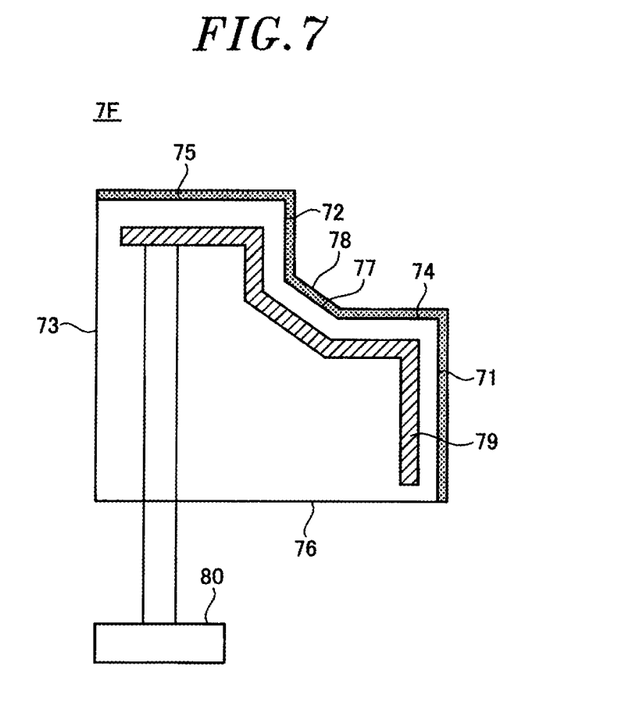

FIG. 7 is an example of a cross-sectional view schematically showing a wafer holder 7F according to a modification. The wafer holder 7F has therein an electromagnet 79. A power is supplied to the electromagnet 79 from an external power supply 80. The magnetic functional surface 78 may be formed by generating a magnetic field on the surface of the wafer holder 7F by supplying the power from the external power supply 80 to the electromagnet 79. The generation of the magnetic field can be stopped by shutting off the power from the external power supply 80. With this configuration, the sputtered particles (magnetic material particles) collected on the magnetic functional surface 78 can be separated by stopping the generation of the magnetic field during cleaning (maintenance) of the wafer holder 7F, for example. Accordingly, the cleaning (maintenance) of the wafer holder 7F can be desirably performed.

In the wafer holders 7E and 7F shown in FIGS. 6 and 7, the recesses 74a to 74d (see FIG. 5) may be formed on the inner upper surface 74. Sidewalls and bottom surfaces of the formed recesses 74a to 74d may serve as the magnetic functional surface 78.

Figure 8:
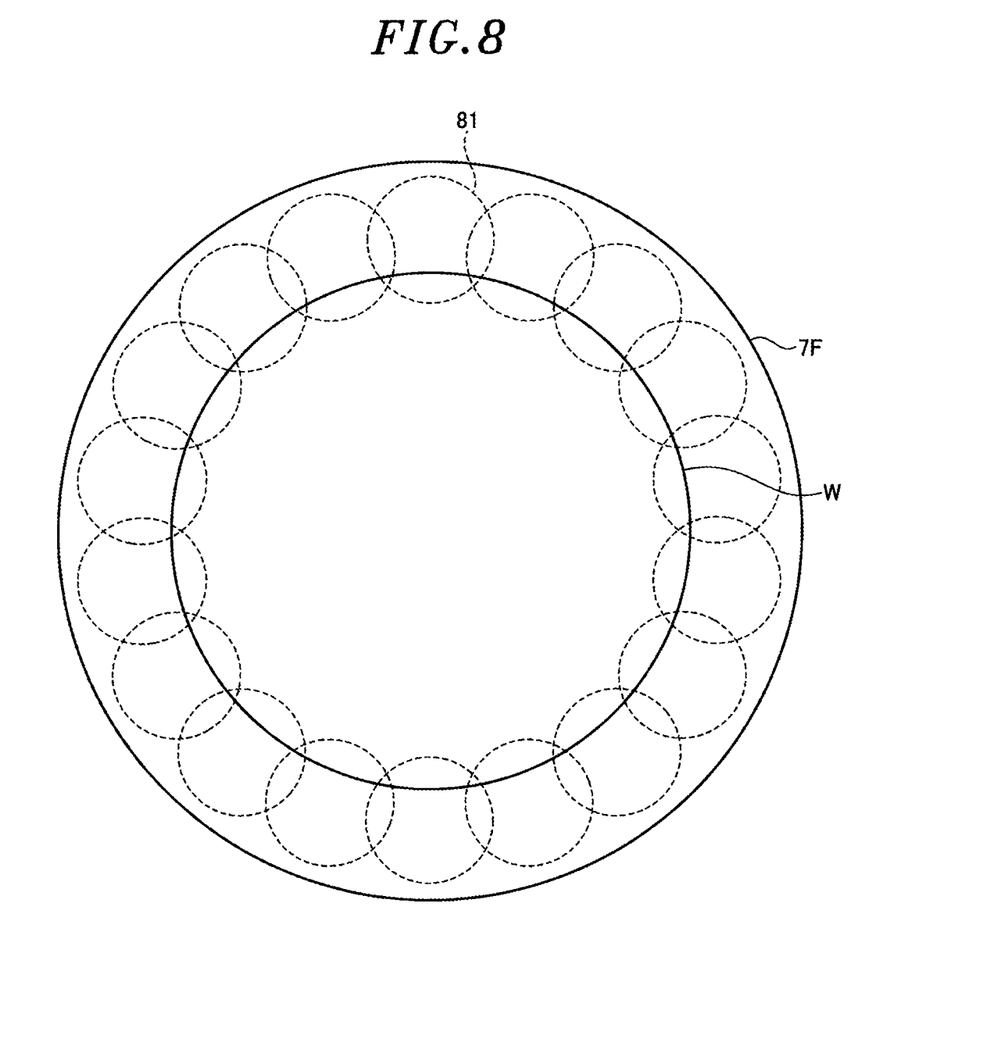
FIG. 8 is a plan view schematically showing an example of arrangement of a substrate and a magnetic field generated by a wafer holder having a magnetic functional surface.

FIG. 8 is a plan view schematically showing an example of an arrangement of the substrate W and a magnetic field 81 generated by the wafer holder 7F having the magnetic functional surface 78.

Multiple electromagnets 79 (see FIG. 7) are arranged in the circumferential direction of the wafer holder 7F. FIG. 8 schematically shows magnetic fields 81 generated by the electromagnets 79. The external power supply 80 is configured to supply a power to each of the electromagnets 79. Accordingly, the generated magnetic fields can be individually controlled.

By generating the magnetic field 81 in the wafer holder 7F disposed around the substrate W, the path of the magnetic particles (sputtered particles) emitted from the target 3 can be adjusted. Accordingly, the in-plane uniformity of the magnetic particles formed on the surface of the substrate W can be controlled. Further, it is possible to prevent the rebounded sputtered particles from being adhered to the backside of the substrate W or to the upper surface of the base 5.

While the sputtering apparatus 1 has been described above, the present disclosure is not limited to the above-described embodiments, and various modifications and improvements can be made within the scope of the gist of the present disclosure described in the claims.

Further, while certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A sputtering apparatus comprising:
   a base on which a substrate is placed;
   an annular member disposed at an outer periphery of the base to surround a side surface and a backside of the substrate without being in contact with the substrate; and
   an edge cover that covers an outer edge of an upper surface of the substrate placed on the base,
   wherein the annular member has:
      a first surface facing the backside of the substrate placed on the base with a gap between the first surface and the substrate,
      a second surface facing the side surface of the substrate placed on the base with a gap between the second surface and the substrate, and
      a tapered surface formed at a corner portion between the first surface and the second surface,
   wherein the second surface extends from an upper end of the tapered surface, and
   wherein the upper end of the tapered surface is formed at a position higher than the first surface.

2. The sputtering apparatus of claim 1, wherein the tapered surface is inclined with respect to a planar surface including the first surface at an angle greater than or equal to 45° and less than or equal to 60°.

3. The sputtering apparatus of claim 1, wherein a recess is formed on the first surface.

4. The sputtering apparatus of claim 2, wherein a recess is formed on the first surface.

5. The sputtering apparatus of claim 1, further comprising:
   a target that emits magnetic particles,
   wherein the annular member has a magnetic functional surface that collects the magnetic particles.

6. The sputtering apparatus of claim 2, further comprising:
   a target that emits magnetic particles,
   wherein the annular member has a magnetic functional surface that collects the magnetic particles.

7. The sputtering apparatus of claim 3, further comprising:
   a target that emits magnetic particles,
   wherein the annular member has a magnetic functional surface that collects the magnetic particles.

8. The sputtering apparatus of claim 5, wherein the annular member has an electromagnet that generates a magnetic field on the magnetic functional surface.

9. The sputtering apparatus of claim 6, wherein the annular member has an electromagnet that generates a magnetic field on the magnetic functional surface.

10. The sputtering apparatus of claim 7, wherein the annular member has an electromagnet that generates a magnetic field on the magnetic functional surface.

11. The sputtering apparatus of claim 8, wherein the annular member has a plurality of electromagnets, and magnetic fields of the electromagnets are individually controlled.

12. The sputtering apparatus of claim 9, wherein the annular member has a plurality of electromagnets, and magnetic fields of the electromagnets are individually controlled.

13. The sputtering apparatus of claim 10, wherein the annular member has a plurality of electromagnets, and magnetic fields of the electromagnets are individually controlled.

* * * * *